United States Patent
An et al.

(10) Patent No.: US 8,259,527 B2
(45) Date of Patent: Sep. 4, 2012

(54) SELF-REFRESH TEST CIRCUIT OF SEMICONDUCTOR MEMORY APPARATUS

(75) Inventors: Sun Mo An, Gyeonggi-do (KR); Jong Yeol Yang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 281 days.

(21) Appl. No.: 12/649,033

(22) Filed: Dec. 29, 2009

(65) Prior Publication Data

US 2011/0103165 A1    May 5, 2011

(30) Foreign Application Priority Data

Oct. 29, 2009 (KR) .................. 10-2009-0103576

(51) Int. Cl.
*G11C 7/00* (2006.01)
(52) U.S. Cl. .......... 365/222; 365/191; 365/201
(58) Field of Classification Search .......... 365/222, 365/201, 191
See application file for complete search history.

(56) References Cited

U.S. PATENT DOCUMENTS

| | | | |
|---|---|---|---|
| 5,566,117 A * | 10/1996 | Okamura et al. | 365/222 |
| 6,486,493 B2 * | 11/2002 | Arimoto et al. | 257/48 |
| 6,990,032 B2 | 1/2006 | Jang | |
| 7,038,968 B2 | 5/2006 | Kim | |
| 2005/0105352 A1 | 5/2005 | Lee | |
| 2005/0228611 A1 | 10/2005 | Kim | |
| 2006/0066386 A1 | 3/2006 | Hong | |
| 2006/0087901 A1 | 4/2006 | Hong et al. | |

FOREIGN PATENT DOCUMENTS

| | | |
|---|---|---|
| JP | 2005-196952 A | 7/2005 |
| JP | 2005-216429 A | 8/2005 |
| JP | 2006-004558 A | 1/2006 |
| KR | 1020030001826 A | 1/2003 |
| KR | 1020040092747 A | 11/2004 |
| KR | 1020060008434 A | 1/2006 |
| KR | 1020070002743 A | 1/2007 |

* cited by examiner

*Primary Examiner* — Hoai V Ho
*Assistant Examiner* — Kretelia Graham
(74) *Attorney, Agent, or Firm* — Ladas & Parry LLP

(57) ABSTRACT

A self-refresh test circuit includes a test clock generation unit, a pulse generation unit, a period signal selection unit, and a self-refresh pulse control unit. The test clock generation unit divides a clock signal to generate a plurality of divided clock signals having different periods when a test enable signal is enabled, and outputs one of the plurality of divided clock signals as a selected clock signal. The pulse generation unit generates a test period signal in response to the selected clock signal. The period signal selection unit outputs one of the test period signal and a self-refresh period signal as a selected period signal. The self-refresh pulse control unit generates a self-refresh pulse in response to a self-refresh exit signal and the selected period signal.

10 Claims, 3 Drawing Sheets

_US 8,259,527 B2_

SELF-REFRESH TEST CIRCUIT OF SEMICONDUCTOR MEMORY APPARATUS

CROSS-REFERENCES TO RELATED APPLICATION

The present application claims priority under 35 U.S.C. §119(a) to Korean application number 10-2009-0103576, filed on Oct. 29, 2009, in the Korean Intellectual Property Office, which is incorporated herein by reference in its entirety as set forth in full.

BACKGROUND

1. Technical Field

The present invention relates to semiconductor integrated circuits, and more particularly, to a self-refresh test circuit of a semiconductor memory apparatus.

2. Related Art

A semiconductor memory apparatus stores the value of data as a voltage level stored in a capacitor. Due to current leakage of the capacitor, the voltage stored in the capacitor cannot be maintained at the same voltage level. Therefore, the semiconductor memory apparatus is required to perform a refresh operations periodically to maintain the voltage level held by the capacitor.

The semiconductor memory apparatus operates in an auto-refresh mode or self-refresh mode. In the auto-refresh mode, a refresh operation is performed in accordance with an external command. In the self-refresh mode, a refresh operation is performed in accordance with an internal command of the semiconductor memory apparatus.

FIG. 1 is a configuration diagram of a self-refresh pulse control unit of a conventional semiconductor memory apparatus. Referring to FIG. 1, the self-refresh pulse control unit 10 outputs a self-refresh period signal 'SRF_ps' as a self-refresh pulse 'P_srf' when a self-refresh exit signal 'SRF_exit' is disabled. When the self-refresh exit signal 'SRF_exit' is enabled, the self-refresh pulse control unit 10 fixes the self-refresh pulse 'P_srf' to a specific level. In this case, the self-refresh period signal 'SRF_ps' is a signal which is synchronized with a clock signal to be enabled every predetermined period, and the self-refresh exit signal 'SRF_exit' is a signal which is inputted from the outside of the semiconductor memory apparatus and is not is synchronized with a clock signal.

When the semiconductor memory apparatus enters the self-refresh mode, the self-refresh pulse control unit 10 outputs the self-refresh pulse 'P_srf' which is enabled every predetermined period. When the self-refresh exit signal 'SRF_exit' is enabled in an enable interval of the self-refresh period signal 'SRF_ps', the self-refresh pulse 'P_srf' is disabled. At this time, the self-refresh pulse 'P_srf' has an enable interval shorter than a set enable interval, and the signal or pulse having a shorter enable interval than the set enable interval is referred to as a glitch signal or pulse. A glitch signal or pulse, such as this, may cause a malfunction of the semiconductor memory apparatus.

To test whether or not the semiconductor memory apparatus malfunctions when the self-refresh pulse 'P_srf' is generated as a glitch pulse, a test of enabling the self-refresh exit signal 'SRF_exit' in the enable interval of the self-refresh period signal 'SRF_ps' is repeated.

Semiconductor memory apparatuses are known to be susceptible to changes in process, voltage, and temperature (P.V.T.) that the respective semiconductor memory apparatuses have different self-refresh periods. Therefore, since it is difficult to find an enable interval of the self-refresh period signal 'SRF_ps', the test time increases.

SUMMARY

A self-refresh test circuit of a semiconductor memory apparatus capable of setting a self-refresh period during a test is described herein.

In one embodiment of the present invention, a self-refresh test circuit includes: a test clock generation unit configured to divide a clock signal to generate a plurality of divided clock signals having different periods when a test enable signal is enabled, and output one of the plurality of divided clock signals as a selected clock signal; a pulse generation unit configured to generate a test period signal in response to the selected clock signal; a period signal selection unit configured to output one of the test period signal and a self-refresh period signal as a selected period signal; and a self-refresh pulse control unit configured to generate a self-refresh pulse in response to a self-refresh exit signal and the selected period signal.

In another embodiment of the present invention, a self-refresh test circuit includes: a test period signal generation unit configured to generate a pulse which is enabled every predetermined period, in response to a test enable signal, and output the generated pulse as a test period signal; a period signal selection unit configured to output a self-refresh period signal or the test period signal as a selected period signal; and a self-refresh pulse control unit configured to generate a self-refresh pulse in response to a self-refresh exit signal and the selected period signal.

BRIEF DESCRIPTION OF THE DRAWINGS

Features, aspects, and embodiments are described in conjunction with the attached drawings, in which.

DETAILED DESCRIPTION

Hereinafter, a self-refresh test circuit of a semiconductor memory apparatus according to the present invention will be described below with reference to the accompanying drawings through preferred embodiments.

Figure 1:
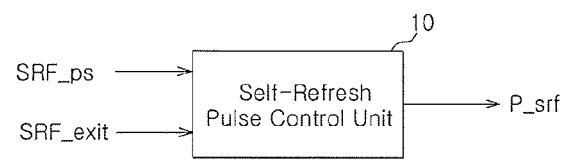
FIG. 1 is a configuration diagram of a self-refresh pulse control unit of a conventional semiconductor memory apparatus.
Figure 2:
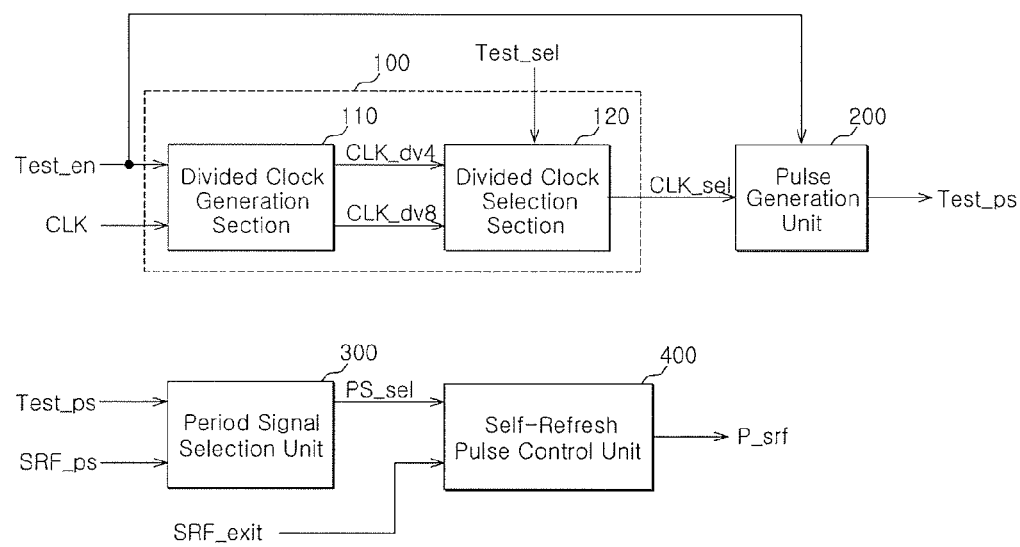
FIG. 2 is a configuration diagram of a self-refresh test circuit of a semiconductor memory apparatus according to one embodiment.

Referring to FIG. 2, the self-refresh test circuit of the semiconductor memory apparatus according to one embodiment includes a test clock generation unit 100, a pulse generation unit 200, a period signal selection unit 300, and a self-refresh pulse control unit 400.

When a test enable signal 'Test-en' is enabled, the test clock generation unit 100 divides a clock signal 'CLK' to generate a divide-by-four clock signal 'CLK_dv4' and a divide-by-eight clock signal 'CLK_dv8', and outputs one of the divide-by-four clock signal 'CLK_dv4' or the divide-by-eight clock signal 'CLK_dv8' as a selected clock signal 'CLK_sel'. At this time, the divide-by-four clock signal 'CLK_dv4' has a period four times longer than that of the clock signal 'CLK', and the divide-by-eight clock signal 'CLK_dv8' has a period eight times longer than that of the clock signal 'CLK'.

The test clock generation unit 100 includes a divided clock generation section 110 and a divided clock selection section 120.

When the test enable test 'Test_en' is enabled, the divided clock generation section 110 divides the clock signal 'CLK' by four to generate the divide-by-four clock signal 'CLK_dv4' and divides the divide-by-four clock signal 'CLK_dv4' by two to generate the divide-by-eight clock signal 'CLK_dv8'.

The divided clock selection section 120 selects one of the divide-by-four clock signal 'CLK_dv4' or the divide-by-eight clock signal 'CLK_dv8' in response to a test selection signal 'Test_sel', and outputs the selected signal as the selected clock signal 'CLK_sel'. For example, the divided clock selection section 120 outputs the divide-by-four clock signal 'CLK_dv4' as the selected clock signal 'CLK_sel' when the test selection signal 'Test_sel' has a high level, and outputs is the divide-by-eight clock signal 'CLK_dv4' as the selected clock signal 'CLK_sel' when the test selection signal 'Test_sel' has a low level.

The pulse generation unit 200 generates a test period signal 'Test_ps' in response to the selected clock signal 'CLK_sel'. For example, the pulse generation unit 200 generates a pulse which is enabled whenever the selected clock signal 'CLK_sel' transits to a specific level, and outputs the generated pulse as the test period signal 'Test_ps'.

The period signal selection unit 300 selects one of the test period signal 'Test_ps' and a self-refresh period signal 'SRF_ps', and outputs the selected signal as a selected period signal 'PS_sel'. For example, the period signal selection unit 300 outputs the self-refresh period signal 'SRF_ps' as the selected period signal 'PS_sel' when the test period signal 'Test_ps' is disabled at a low level, and outputs the test period signal 'Test_ps' as the selection period signal 'PS_sel' when the self-refresh period signal 'SRF_ps' is disabled at a low level.

The self-refresh pulse control unit 400 generates a self-refresh pulse 'P_srf' in response to a self-refresh exit signal 'SRF_exit' and the selected period signal 'PS_sel'. For example, the self-refresh pulse control unit 400 outputs the selected period signal 'PS_sel' as the self-refresh pulse 'P_srf' when the self-refresh exit signal 'SRF_exit' is disabled. When the self-refresh exit signal 'SRF_exit' is enabled, the self-refresh pulse control unit 400 fixes the self-refresh pulse 'P_srf' at a specific level.

Figure 3:
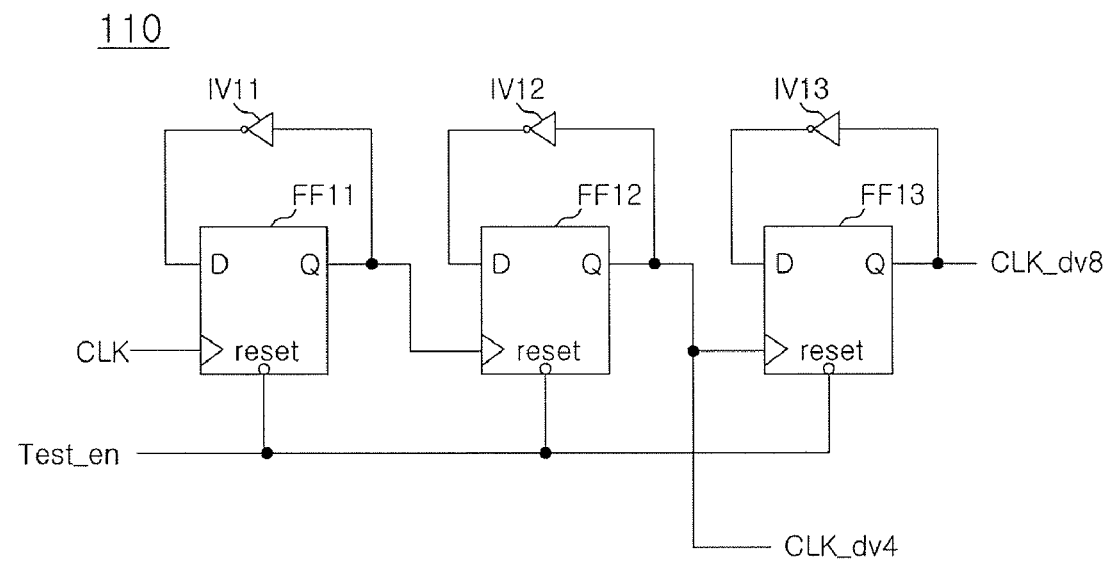
FIG. 3 is a configuration diagram of a divided clock generation unit of FIG. 2.

Referring to FIG. 3, the divided clock generation section 110 includes first to third flip-flops FF11 to FF13 and first to third inverters IV11 to IV13. The first flip-flop FF11 receives the clock signal 'CLK' through a clock input terminal thereof, and receives the test enable signal 'Test_en' through a reset terminal reset thereof. The first inverter IV11 has an input terminal to which an output terminal Q of the first flip-flop FF11 is connected and an output terminal to which an input terminal D of the first flip-flop FF11 is connected. The second flip-flop FF12 has a clock input terminal to which the output terminal Q of the first flip-flop FF11 is connected, and receives the test enable signal 'Test_en' through a reset terminal reset thereof. The second inverter IV12 has an input terminal to which an output terminal Q of the second flip-flop FF12 is connected and an output terminal to which an input terminal D of the second flip-flop FF12 is connected. The third flip-flop FF13 has a clock input terminal to which the output terminal Q of the second flip-flop FF12 is connected, and receives the test enable signal 'Test_en' through a reset terminal reset thereof. The third inverter IV13 has an input terminal to which the output terminal Q of the third flip-flop FF13 is connected and an output terminal to which an input terminal D of the third flip-flop FF13 is connected. In this case, a combination of the first inverter IV11 and the first flip-flop FF11, a combination of the second inverter IV12 and the second flip-flop FF12, and a combination of the third inverter IV13 and the third flip-flop FF13, respectively, divide an input signal by two, and can thus be referred to as dividers. The second flip-flop FF12 outputs the divide-by-four clock signal 'CLK_dv4', and the third flip-flop FF13 outputs the divide-by-eight clock signal 'CLK_dv8'.

Figure 4:
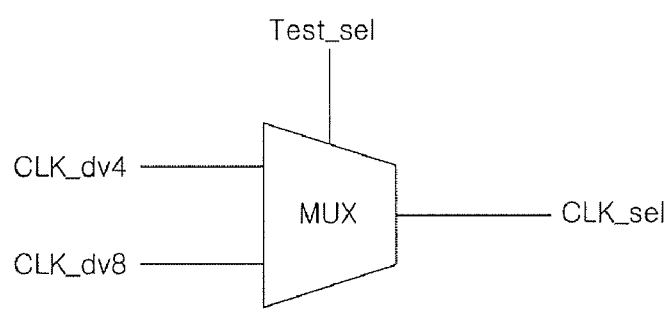
FIG. 4 is a configuration diagram of a divided clock selection unit of FIG. 2.

Referring to FIG. 4, the divided clock selection section 120 may be implemented as a multiplexer MUX. The multiplexer MUX receives the divide-by-four clock signal 'CLK_dv4' and the divide-by-eight clock signal 'CLK_dv8' through the respective input terminals thereof, receives the test selection signal 'Test_sel' through the control terminal thereof, and outputs the selected clock signal 'CLK_sel' through the output terminal thereof.

Whenever the test enable signal 'Test_en' is enabled and the selected clock signal 'CLK_sel' transits at a high level, the pulse generation unit 200 generates a pulse and outputs the generated pulse as the test period signal 'Test_ps'. When the test enable signal 'Test_en' is disabled, the pulse generation unit 200 fixes the test period signal 'Test_en' at a specific level.

Figure 5:
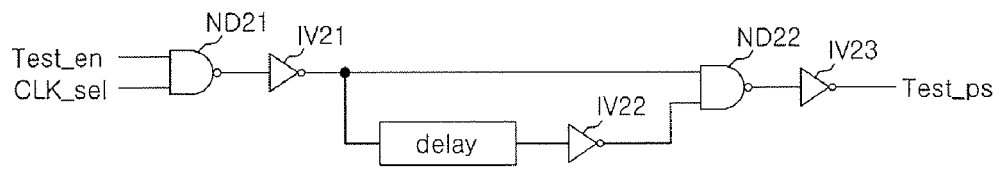
FIG. 5 is a configuration diagram of a pulse generation unit of FIG. 2.

Referring to FIG. 5, the pulse generation unit 200 includes first and second NAND gates ND21 and ND22, fourth to sixth inverters IV21 to IV23, and a delay section 'delay'. The first NAND gate ND21 receives the test enable signal 'Test_en' and the selected clock signal 'CLK_sel'. The fourth inverter IV21 receives an output signal of the first NAND gate ND21. The delay section 'delay' receives an output signal of the fourth inverter IV21. The fifth inverter IV22 receives an output signal of the delay section 'delay'. The second NAND gate ND22 receives output signals from the fourth inverter IV21 and the fifth inverter IV22. The sixth inverter IV23 receives an output signal of the second NAND gate ND22 and outputs the test period signal 'Test_ps'.

Figure 6:
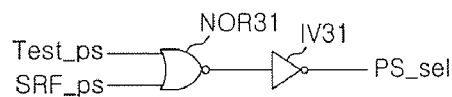
FIG. 6 is a configuration diagram of a period signal selection unit of FIG. 2.

Referring to FIG. 6, the period signal selection unit 300 includes a NOR gate NOR31 and a seventh inverter IV31. The NOR gate NOR31 receives the test period signal 'Test_ps' and the self-refresh period signal 'SRF_ps'. The seventh inverter IV31 receives an output signal of the NOR gate NOR31 and outputs the selected period signal 'PS_sel'.

The self-refresh test circuit of the semiconductor memory apparatus configured in such a manner operates as follows.

Figure 7:
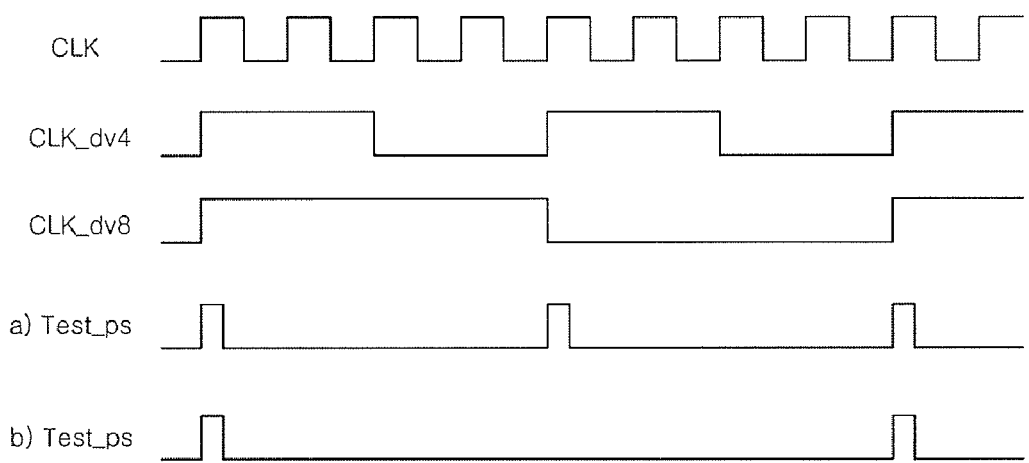
FIG. 7 is a timing diagram of the self-refresh test circuit according to one embodiment.

Referring to FIG. 7, an operation of generating a test period signal Test_ps will be described.

The divided clock generation section 110 divides a clock signal CLK by four to generate a divide-by-four clock signal 'CLK_dv4', and divides the divide-by-four clock signal 'CLK_dv4' by two to generate a divide-by-eight clock signal 'CLK_dv8'.

Therefore, the clock signal 'CLK' should transit two times to a high level, in order that the level of the divide-by-four clock signal 'CLK_dv4' changes. Furthermore, whenever the divide-by-four clock signal 'CLK_dv4' transits at a high level, the level of the divide-by-eight clock signal 'CLK_dv8' changes.

When the divide-by-four clock signal 'CLK_dv4' is outputted as a selected clock signal 'CLK_sel' ((a) of FIG. 7), the test period signal 'Test_ps' is outputted as a pulse which is generated whenever the divide-by-four clock signal 'CLK_dv4' transits at a high level.

When the divide-by-eight clock signal 'CLK_dv8' is outputted as the selected clock signal 'CLK_sel' ((b) of FIG. 7), the test period signal 'Test_ps' is outputted as a pulse which is generated whenever the divide-by-eight clock signal 'CLK_dv8' transits at a high level.

Since a self-refresh period signal 'SRF_ps' is disabled to a low level during a test, the test period signal 'Test_ps' is outputted as a selected period signal 'PS_sel'.

While the test is not performed, the test period signal 'Test_ps' is disabled at a low level. Therefore, the self-refresh period signal 'SRF_ps' is outputted as the selected period signal 'PS_sel'.

The self-refresh pulse control unit 400 generates a self-refresh pulse 'P_srf' in response to the selected period signal 'PS_sel' and a self-refresh exit signal 'SRF_exit'.

The self-refresh test circuit according to this embodiment selects a divide-by-four clock signal 'CLK_dv4' or divide-by-eight clock signal 'CLK_dv8' in response to a test selection signal 'Test_sel', generates a test period signal 'Test_ps' using the selected clock signal, and outputs the test period signal 'Test_ps' to the self-refresh pulse control unit 400.

Therefore, in this embodiment, the period of the test period signal can be obtained by a simple calculation. For example, when a clock signal has a period of 80 Hz, the period of a divide-by-four clock signal is 20 Hz (calculation formula: clock period/4 or clock period/8).

Furthermore, the self-refresh test circuit according to the embodiment is configured to start the clock division only when the test enable signal is enabled. Therefore, it is easy to catch the enable timing of the test period signal generated as a divided clock signal.

Compared with the related art, the embodiment can realize the following advantage. That is, when the self-refresh pulse is so enabled during a test, it is easy to enable the self refresh exit signal. Therefore, the time of a self-refresh related test (self-refresh exit malfunction test) can be reduced, making it possible to realize an increase the precision of the test.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A self-refresh test circuit comprising:
a test clock generation unit configured to divide a clock signal to generate a plurality of divided clock signals having different periods when a test enable signal is enabled, and to output one of the plurality of divided clock signals as a selected clock signal;
a pulse generation unit configured to generate a test period signal in response to the selected clock signal;
a period signal selection unit configured to output one of the test period signal and a self-refresh period signal as a selected period signal; and
a self-refresh pulse control unit configured to generate a self-refresh pulse in response to a self-refresh exit signal and the selected period signal.

2. The self-refresh test circuit according to claim 1, wherein the test clock generation unit comprises:

a divided clock generation section configured to divide the clock signal to generate the plurality of divided clock signals when the test enable signal is enabled; and
a divided clock selection section configured to output one of the plurality of divided clocks as the selected clock signal in response to a test selection signal.

3. The self-refresh test circuit according to claim 2, wherein the divided clock generation section comprises a plurality of dividers connected in series.

4. The self-refresh test circuit according to claim 1, wherein the pulse generation unit generates a pulse which is enabled whenever the selected clock signal transits at a specific level, and outputs the generated pulse as the test period signal.

5. The self-refresh test circuit according to claim 1, wherein the pulse generation unit generates a pulse which is enabled whenever the selected clock signal rises, and outputs the generated pulse as the test period signal.

6. The self-refresh test circuit according to claim 1, wherein the period signal selection unit outputs the self-refresh period signal as the selected period signal when the test period signal is disabled, and outputs the test period signal as the selected period signal when the self-refresh period signal is disabled.

7. The self-refresh test circuit according to claim 1, wherein the self-refresh pulse control unit outputs the selected period signal as the self-refresh pulse when the self-refresh exit signal is disabled, and fixes the self-refresh pulse at a specific level when the self-refresh exit signal is enabled.

8. A self-refresh test circuit comprising:
a test period signal generation unit configured to generate a pulse which is enabled every predetermined period in response to a test enable signal and to output the generated pulse as a test period signal;
a period signal selection unit configured to output a self-refresh period signal or the test period signal as a selected period signal; and
a self-refresh pulse control unit configured to generate a self-refresh pulse in response to a self-refresh exit signal and the selected period signal,
wherein the period signal selection unit is configured to output the self-refresh period signal as the selected period signal when the test period signal is disabled, and to output the test period signal as the selected period signal when the self-refresh period signal is disabled.

9. The self-refresh test circuit according to claim 8, wherein the test period signal generation unit comprises
a divided clock generation section configured to divide a clock signal when the test enable signal is enabled, and to generate a plurality of divided clock signals having different periods;
a divided clock selection section configured to select one of the plurality of divided clock signals in response to a test selection signal, and to output the divided clock signal selected by the test selection signal as a selected clock signal; and
a pulse generation section configured to generate the pulse whenever the selected clock rises, and to output the generated pulse as the test period signal.

10. The self-refresh test circuit according to claim 8, wherein the self-refresh pulse control unit is configured to output the selected period signal as the self-refresh pulse when the self-refresh exit signal is disabled, and configured to fix the self-refresh pulse at a specific level when the self-refresh exit signal is enabled.

* * * * *